United States Patent
Hagisawa et al.

(10) Patent No.: US 8,970,306 B2
(45) Date of Patent: Mar. 3, 2015

(54) WIRELESS COMMUNICATION DEVICE

(71) Applicant: Renesas Electronics Corporation, Kanagawa (JP)

(72) Inventors: Hiroshi Hagisawa, Kanagawa (JP); Satoshi Sakurai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 182 days.

(21) Appl. No.: 13/706,570

(22) Filed: Dec. 6, 2012

(65) Prior Publication Data
US 2013/0163647 A1 Jun. 27, 2013

(30) Foreign Application Priority Data
Dec. 22, 2011 (JP) ................. 2011-281659

(51) Int. Cl.
*H03G 3/30* (2006.01)
*H04W 52/02* (2009.01)

(52) U.S. Cl.
CPC .................. *H04W 52/028* (2013.01)
USPC ...................................... 330/285

(58) Field of Classification Search
CPC .... H03F 1/0211; H03F 1/0216; H03F 1/0244
USPC ............................ 330/2, 285, 296
See application file for complete search history.

(56) References Cited

U.S. PATENT DOCUMENTS

| 7,948,318 B2 * | 5/2011 | Hongo et al. | 330/285 |
| 8,160,519 B2 * | 4/2012 | Nentwig | 455/127.1 |
| 8,344,806 B1 * | 1/2013 | Franck et al. | 330/285 |

FOREIGN PATENT DOCUMENTS

| JP | 2003-198294 A | 7/2003 |
| JP | 2009-177240 A | 8/2009 |

* cited by examiner

*Primary Examiner* — Steven J Mottola
(74) *Attorney, Agent, or Firm* — Mattingly & Malur, PC

(57) ABSTRACT

The present invention improves the transmission power characteristics of a wireless communication device or reduces the resources required for improving the transmission power characteristics. The wireless communication device includes, for example, a bias detection circuit, an error amplifier, and a correction circuit. The bias detection circuit detects a bias that is supplied to a high-frequency power amplifier. The error amplifier amplifies the error between the detected bias and a predetermined reference voltage. The correction circuit searches for a bit correction value that minimizes the error detected in the error amplifier. During a normal operation, a digital-to-analog conversion circuit receives a bias instruction code from a baseband unit and outputs a bias setup voltage, which is obtained when the bit correction value is reflected in the bias instruction code. A bias corresponding to the bias setup voltage is then supplied to the high-frequency power amplifier.

16 Claims, 13 Drawing Sheets

WIRELESS COMMUNICATION DEVICE

CROSS-REFERENCE TO RELATED APPLICATIONS

The disclosure of Japanese Patent Application No. 2011-281659 filed on Dec. 22, 2011 including the specification, drawings, and abstract is incorporated herein by reference in its entirety.

BACKGROUND

The present invention relates to a wireless communication device, and more particularly to an effective technology applicable to a wireless communication device capable of correcting transmission power characteristics.

A technology described, for instance, in Japanese Unexamined Patent Publication No. 2003-198294 provides system-wide correction of transmission signal power level variations in a power amplifier device. More specifically, a control device, which acts as a baseband circuit, recognizes a transmission signal power level detected by a detector circuit, and the bias of the power amplifier device is changed through a D/A converter until a predetermined transmission signal power level is reached. The resulting output voltage of the D/A converter is then stored in a memory to correct the variations.

A configuration described, for instance, in Japanese Unexamined Patent Publication No. 2009-177240 includes, for example, a plurality of current detection circuits that detect the base current and collector current of a power-amplifying bipolar transistor, a calculator that inputs the result of the detection and calculates a predetermined parameter, and a correlation table that selects predefined bias conditions in accordance with the parameter calculated by the calculator.

SUMMARY

In recent years, a transmission section of a wireless communication system, which is typically represented by a mobile phone, is requested to reduce, for example, its power consumption and variations in the transmission power characteristics. A main factor determining the power consumption and transmission power characteristics would be variations in the bias of a high-frequency power amplifier. Variations in the bias of the high-frequency power amplifier may, for example, decrease a power-added efficiency and increase a distortion. The value of the bias is determined in accordance, for instance, with an instruction from a baseband section. In reality, however, a process for receiving the instruction and actually generating transmission power is performed by a plurality of circuits. Therefore, the relationship between the instructed bias value and the actual transmission power level is determined by the result of combination of various variation factors. When viewed on an individual variation factor basis, variations occur in more or less a regular manner. However, when the various variation factors are combined, more irregular variations may occur on the whole.

Under the above circumstances, the relationship between the instructed bias value and the actual transmission power level may be accurately determined, for example, by creating a correlation table indicative of the relationship between the instructed bias value and the transmission power level in accordance with actual measurements of the actual transmission power level and making corrections with the correlation table. FIG. 14 is a schematic block diagram illustrating an exemplary configuration of a wireless communication system that has been studied as a premise underlying the present invention. The wireless communication system shown in FIG. 14 includes a high-frequency power amplifier HPA, a bias generation circuit BSGEN, a directional coupler CPL, a power detection circuit PDETC, a digital-to-analog conversion circuit DAC, an analog-to-digital conversion circuit ADC, and a baseband unit BBU.

In the above-described configuration, the baseband unit BBU issues an instruction value indicative of a predetermined transmission power level to the bias generation circuit BSGEN through the digital-to-analog conversion circuit DAC, and the bias generation circuit BSGEN supplies a bias corresponding to the instruction value to the high-frequency power amplifier HPA. Meanwhile, a transmission power level (Pout) from the high-frequency power amplifier HPA is detected by the directional coupler CPL and by the power detection circuit PDETC and communicated to the baseband unit BBU through the analog-to-digital conversion circuit ADC. The baseband unit BBU then compares the detected transmission power level to the instruction value. If the detected transmission power level is different from the instruction value, the baseband unit BBU instructs the bias generation circuit BSGEN through the digital-to-analog conversion circuit DAC to change the bias. The baseband unit BBU repeats the above process to obtain the error between the detected transmission power level and the instruction value, creates a correlation table describing, for instance, an error with respect to each instruction value indicative of the transmission power level, and stores the correlation table in a nonvolatile memory ROM. Subsequently, the baseband unit BBU can make error corrections by referencing the correlation table and issuing an instruction indicative of the transmission power level.

However, when the correction method depicted in FIG. 14 is used, irregular variations may occur on the whole as mentioned earlier because various variation factors exist in a path used between the instant at which the baseband unit BBU issues the instruction indicative of the transmission power level and the instant at which the result is obtained. Hence, it is necessary to minutely create the correlation table and use a large amount of correction resources, for instance, for an enormous amount of table creation time and for an enormous amount of memory. In reality, therefore, the correlation table is created by using a limited amount of resources. In such an instance, it is difficult, on the contrary, to obtain optimum correlation table settings (correction parameters). This makes it difficult to enhance the accuracy of transmission power characteristics with respect to the instructed bias value. In other words, the above situation may occur because the correction method depicted in FIG. 14 corrects overall variations of the system collectively and averagely.

Later-described embodiments are implemented in view of the above circumstances and for the purpose, for instance, of improving the transmission power characteristics of a wireless communication device or reducing the resources required for improving the transmission power characteristics. These and other advantages and novel features of the present invention will become apparent from the following detailed description and from the accompanying drawings.

Representative means for solving the earlier-described problems, which are provided by the present invention, will be briefly summarized below.

According to one aspect of the present invention, there is provided a wireless communication device including a power-amplifying transistor, a bias generation circuit, a digital-to-analog conversion circuit, a correction circuit block, a normal operation mode, and a correction operation mode.

The digital-to-analog conversion circuit generates a first input level. The bias generation circuit generates a bias in accordance with the first input level and supplies the generated bias to the power-amplifying transistor. In the correction operation mode, the correction circuit block applies a test input level to the bias generation circuit as the first input level, searches for a test input level variation amount that causes the level of a first node included in the bias generation circuit to coincide with a predetermined reference level, and retains the variation amount as a correction value. In the normal operation mode, the digital-to-analog conversion circuit generates the first input level in a reflection of the correction value.

The above-described aspect of the present invention makes it possible to improve the transmission power characteristics or reduce the resources required for improving the transmission power characteristics.

BRIEF DESCRIPTION OF THE DRAWINGS

FIGS. 5A and 5B are diagrams illustrating corrections that are made when bias variations exist in the wireless communication device shown in FIGS. 1 and 4, in which FIG. 5A is a diagram illustrating a case where element variations exist in the bias generation circuit, and FIG. 5B is a diagram illustrating a case where the bias setup voltage varies;

DETAILED DESCRIPTION

Figure 1:
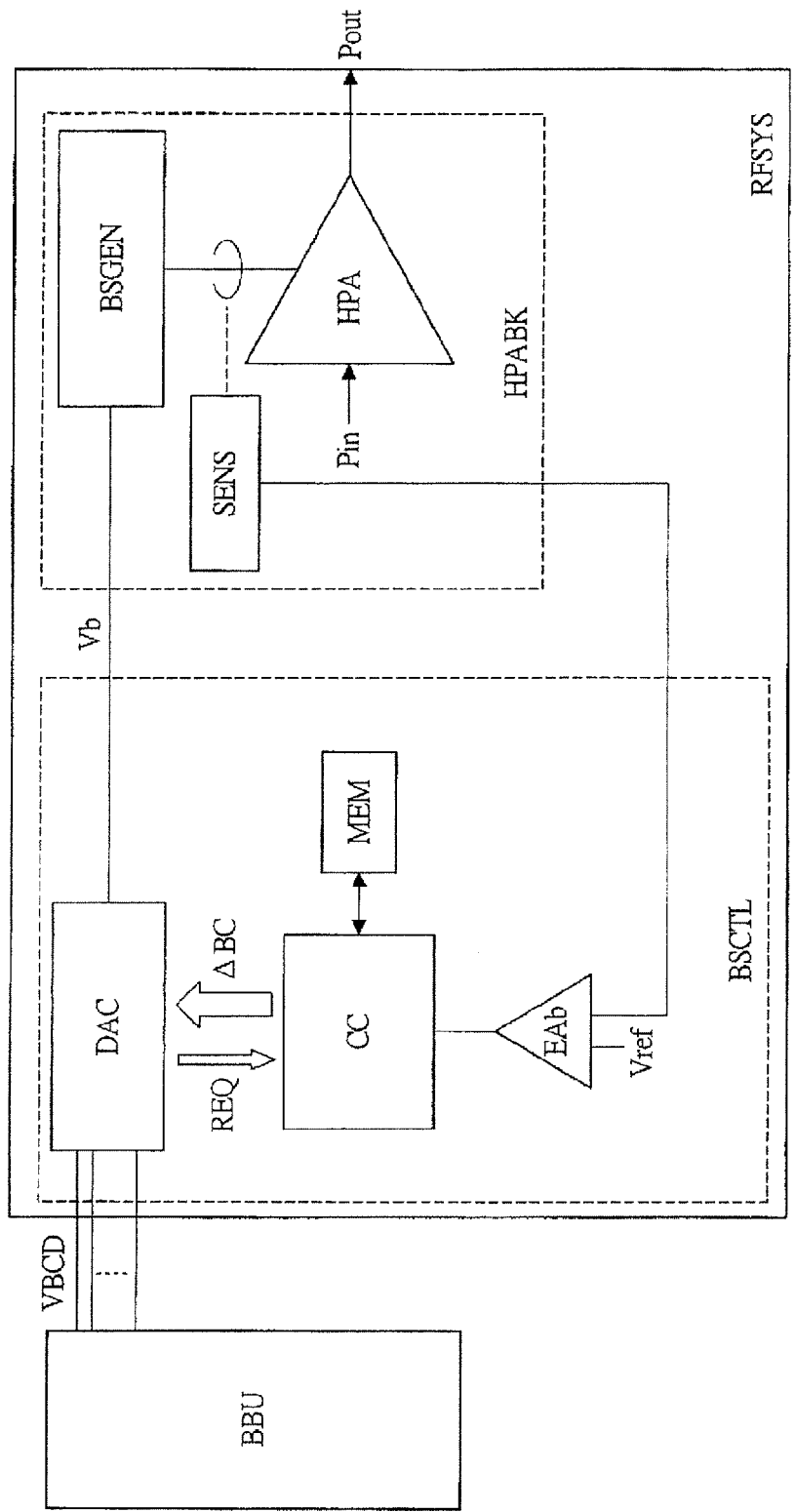
FIG. 1 is a schematic block diagram illustrating an exemplary configuration of essential parts of a wireless communication device according to a first embodiment of the present invention.

In later-described embodiments, if necessary for convenience, the present invention is explained by dividing it into a plurality of sections or embodiments. However, unless otherwise explicitly stated, these sections or embodiments are not irrelevant to each other. There exists such a relationship that, for example, one section or embodiment is a modification, a detailed description, or a complementary explanation of a part or the whole of another section or embodiment. Further, in the later-described embodiments, when the number of elements and the like (including, for instance, the number of pieces, numerical values, amounts, and ranges) are mentioned, unless otherwise particularly specified or the number is apparently limited to a specified number in principle, the number is not limited to the specified number and may be set to a value higher or lower than the specified number.

Furthermore, in the later-described embodiments, it is obvious that structural elements (including element steps) are not always indispensable unless otherwise explicitly stated or except the case where the structural elements are apparently indispensable in principle. Similarly, in the later-described embodiments, when, for instance, the shapes of the structural elements and the positional relationship between the structural elements are mentioned, the substantially approximate or similar shapes and the like are included therein unless otherwise explicitly stated or except the case where it is conceivable that they are apparently excluded in principle. The same holds for the above-mentioned numerical values and ranges.

Moreover, circuit elements included in each functional block of the embodiments are not limited in particular, but are formed over a semiconductor substrate of single crystal silicon or the like by using a known integrated circuit technology for a CMOS transistor (complementary MOS transistor) or the like. Although a MOSFET (Metal Oxide Semiconductor Field Effect Transistor) (abbreviated as a MOS transistor) is used in the embodiments as an example of a MISFET (Metal Insulator Semiconductor Field Effect Transistor), a non-oxide film is not excluded as a gate insulating film. In the accompanying drawings, the gate of a P-channel MOS transistor (PMOS transistor) is marked with an arrow to distinguish it from an N-channel MOS transistor (NMOS transistor). In the accompanying drawings, the coupling of a substrate potential of a MOS transistor is not particularly indicated. As far as the MOS transistor is within the range of normal operation, the method of its coupling is not specifically restricted.

Embodiments of the present invention will now be described in detail with reference to the accompanying drawings. In all the drawings depicting the embodiments, like elements are generally designated by like reference numerals. Such like elements will not be redundantly described.

First Embodiment

Overview of Essential Parts of Wireless Communication Device

FIG. 1 is a schematic block diagram illustrating an exemplary configuration of essential parts of a wireless communication device according to a first embodiment of the present invention. The wireless communication device shown in FIG. 1 includes a baseband unit BBU and a high-frequency system section RFSYS. The baseband unit BBU performs a baseband process. The high-frequency system section RFSYS performs a high-frequency band process. The high-frequency system section RFSYS includes a bias control section BSCTL and a power amplifier section HPABK. The power amplifier section HPABK includes a bias generation circuit BSGEN, a high-frequency power amplifier HPA, and a bias detection circuit SENS. The bias generation circuit BSGEN generates a bias in accordance with a bias setup voltage Vb and supplies the generated bias to the high-frequency power amplifier HPA. The high-frequency power amplifier HPA power-amplifies an input power signal Pin by using the bias as an operating point and outputs an output power signal Pout. The bias detection circuit SENS detects the level of the bias.

The bias control section BSCTL includes an error amplifier EAb, a correction circuit CC, a digital-to-analog conversion circuit DAC, and a memory MEM. The error amplifier EAb compares the result of detection by the bias detection circuit SENS to a predetermined reference voltage Vref and amplifies any error detected by the comparison. The correction circuit CC generates a predefined bit correction value ΔBC in accordance with the output of the error amplifier EAb. The digital-to-analog conversion circuit DAC receives a bias instruction code VBCD for specifying the level of transmission power from the baseband unit BBU and converts a digital code, which is obtained by reflecting the bit correction value ΔBC in the bias instruction code VBCD, to its analog equivalent to output the aforementioned bias setup voltage Vb.

In the above-described exemplary configuration, for example, the relationship between the bias instruction code VBCD in the digital-to-analog conversion circuit DAC and the bias setup voltage Vb and the relationship between the bias setup voltage Vb in the bias generation circuit BSGEN and an actually generated bias may vary due, for instance, to manufacturing variations among individual units of the high-frequency system section RFSYS. In view of such circumstances, the wireless communication device shown in FIG. 1 has a correction operation mode and a normal operation mode, and uses the correction operation mode to correct such variations.

In the correction operation mode, a bias instruction code VBCD for testing is input from the baseband unit BBU, and the reference voltage Vref predetermined in accordance with the bias instruction code VBCD is input into the error amplifier EAb. The bias instruction code VBCD is not limited to what is input from the baseband unit BBU. It may alternatively be input from an external inspection device or the like. It is preferred that the reference voltage Vref be input from an external inspection device or other device capable of setting an accurate voltage value. The digital-to-analog conversion circuit DAC converts the bias instruction code VBCD to its analog equivalent to generate the bias setup voltage Vb on the assumption, for example, that the bit correction value ΔBC in an initial state is zero. The bias generation circuit BSGEN generates a bias (bias current or bias voltage) in accordance with the bias setup voltage Vb, and the bias detection circuit SENS detects the level of the generated bias.

The error amplifier EAb amplifies the error between the level detected by the bias detection circuit SENS and the reference voltage Vref. The correction circuit CC varies the bit correction value ΔBC so as to decrease the error amplified by the error amplifier EAb. This causes the digital-to-analog conversion circuit DAC to update the bias setup voltage Vb by converting a digital code, which is obtained by reflecting the bit correction value ΔBC in the aforementioned bias instruction code VBCD for testing, to its analog equivalent. Subsequently, the above-described process on a bias correction loop is automatically repeated to generate the bit correction value ΔBC that minimizes the error amplified by the error amplifier EAb. The correction circuit CC stores the generated bit correction value ΔBC in the memory MEM. The memory MEM is not specifically defined, but can be implemented, for instance, by a nonvolatile memory. However, if the relationship between the bias instruction code VBCD and the bit correction value ΔBC is fixed or given by a linear function, the memory MEM can be implemented, for instance, by a fuse or a plurality of bonding wires (for retaining information by using a power supply voltage or a ground power supply voltage as a coupling destination).

In the normal operation mode, on the other hand, the digital-to-analog conversion circuit DAC issues a correction value request signal REQ to the correction circuit CC upon receipt of the bias instruction code VBCD for normal operation from the baseband unit BBU. In response to the correction value request signal REQ, the correction circuit CC returns the bit correction value ΔBC. The digital-to-analog conversion circuit DAC outputs the bias setup voltage Vb by converting a digital code, which is obtained by reflecting the bit correction value ΔBC in the bias instruction code VBCD, to its analog equivalent. This makes it possible to make corrections so that the relationship between the bias instruction code VBCD and the bias actually supplied to the high-frequency power amplifier HPA is fixed in each wireless communication device.

Figure 14:
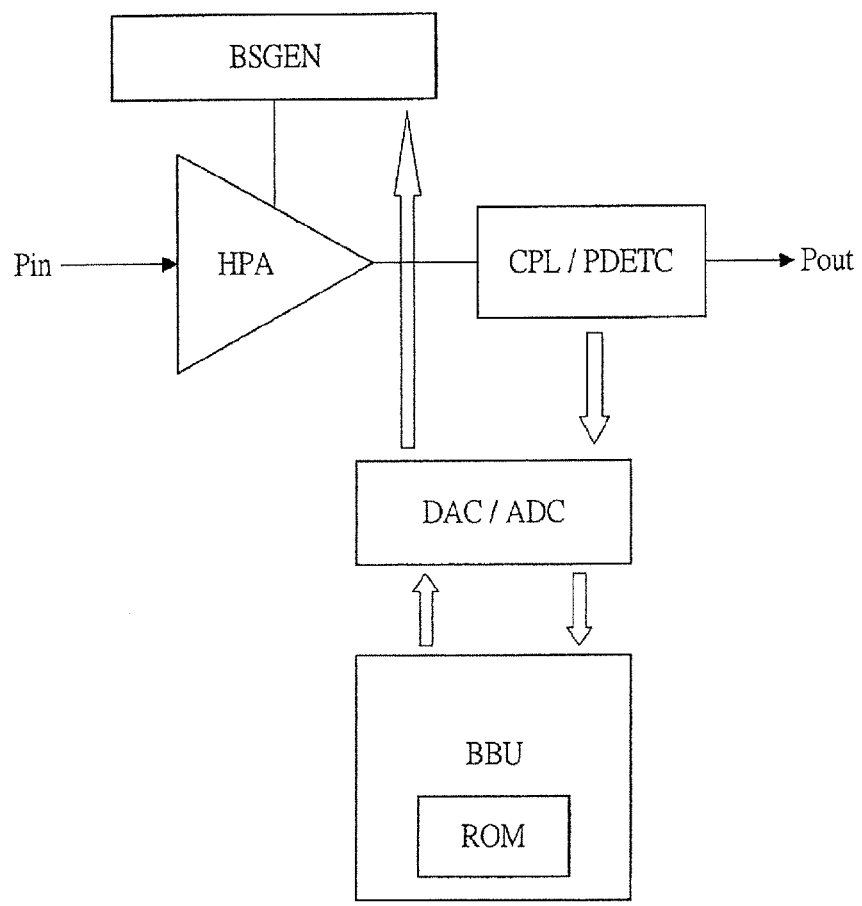
FIG. 14 is a schematic block diagram illustrating an exemplary configuration of a wireless communication system that has been studied as a premise underlying the present invention.

As described above, the wireless communication device according to the first embodiment removes various variation factors on an individual basis, that is, in a manner different from the method depicted in FIG. 14, to simplify the regularity of variations, enhance the accuracy of the relationship between the bias instruction code VBCD and the output power signal Pout, and reduce the resources required for correcting the variations. Above all, the wireless communication device according to the present embodiment takes particular note of a bias that greatly affects transmission power characteristics, and observes and automatically corrects the bias itself by using the bias correction loop built in the aforementioned high-frequency system section RFSYS.

As described above, when a bias-corrected high-frequency system section RFSYS is built in advance, the burden imposed, for instance, on an assembly manufacturer can be reduced when it builds a wireless communication system by combining the baseband unit BBU or the like with the high-frequency system section RFSYS. In other words, even when, for instance, the variations in the entire system including the baseband unit BBU are to be corrected, for instance, by a method similar to the one depicted in FIG. 14, variation elements are already reduced. Therefore, optimum correction parameters can be obtained with ease through the use of limited resources (correlation table creation time, correlation table storage memory, etc.). When the optimum correction parameters are easily obtained, the accuracy of the relationship between an instructed bias value and an actual transmission power level can be enhanced to improve transmission power characteristics (e.g., provide power added efficiency improvement and distortion reduction in the high-frequency power amplifier HPA).

Further, as the method observes and corrects the bias itself without detecting, for example, the transmission power of the high-frequency power amplifier HPA, it is obvious from FIG. 1 that the resources (e.g., circuit size, circuit design time, processing time for correction) required for making the corrections can be reduced. Therefore, it is possible to suppress an increase in the burden imposed on a parts manufacturer of the high-frequency system section RFSYS. Hence, on the whole, the transmission power characteristics can be improved while suppressing an increase in the amount of resources required for variation corrections. When attention is focused on accurate bias correction, it is conceivable that the technology described, for instance, in Japanese Unexamined Patent Publication No. 2009-177240 may be adopted. However, the use of this technology or other similar technology that uses, for example, a plurality of current detection circuits, a calculator, and a correlation table may excessively increase the amount of required resources. Thus, the burden imposed on the parts manufacturer may significantly increase although the burden imposed on the assembly manufacturer can be decreased in some cases.

In a different standpoint, the use of the method depicted in FIG. 1 makes it possible to increase the manufacturing yield, for instance, of the power amplifier section HPABK. In other words, when, for instance, the power amplifier section HPABK is formed by a single semiconductor chip, the manufacturing variations of the high-frequency power amplifier HPA are added to the variations of the bias generation circuit BSGEN so that the transmission power characteristics greatly vary. This may decrease the yield when the semiconductor chip is inspected. Hence, if it is presumed that the method depicted in FIG. 1 can suppress the variations of the bias generation circuit BSGEN, only the high-frequency power amplifier HPA may be inspected for manufacturing variations during the inspection of the power amplifier section HPABK. Therefore, it can be expected that the manufacturing yield will increase. More specifically, even in a situation where a predetermined bias setup voltage Vb does not produce predetermined transmission power characteristics, the semiconductor chip may turn out to be nondefective as far as the predetermined transmission power characteristics are obtained by varying the predetermined bias setup voltage Vb to some extent.

<Details of High-Frequency Power Amplifier and Bias Generation Circuit>

Figure 2:
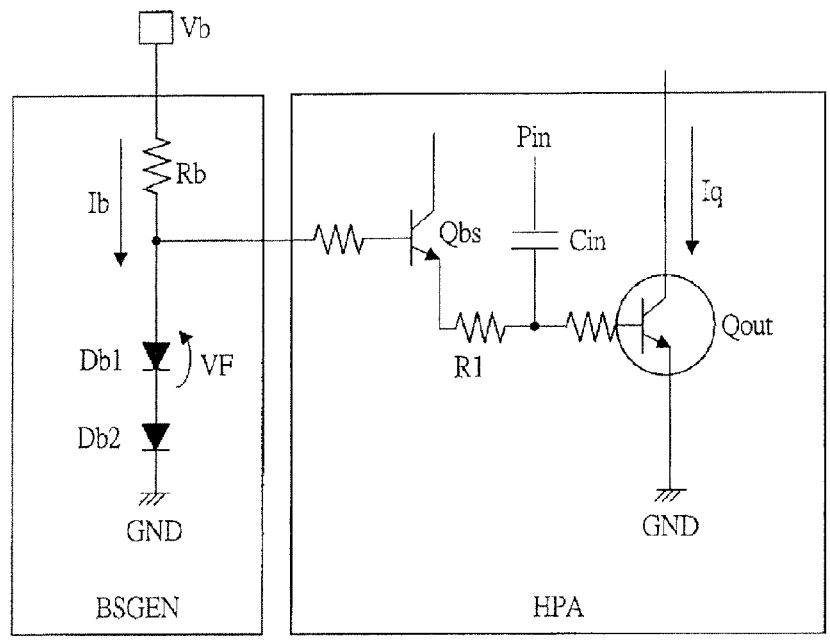
FIG. 2 is a circuit diagram illustrating in detail an exemplary configuration of a bias generation circuit and of a high-frequency power amplifier, which are both included in the wireless communication device shown in FIG. 1.

FIG. 2 is a circuit diagram illustrating in detail an exemplary configuration of the bias generation circuit and of the high-frequency power amplifier, which are both included in the wireless communication device shown in FIG. 1. A wireless communication device based, for instance, on W-CDMA (Wideband Code Division Multiple Access) and LTE (Long Term Evolution) may use circuitry shown in FIG. 2. In FIG. 2, the high-frequency power amplifier HPA includes, for example, a power-amplifying bipolar transistor Qout, a bias bipolar transistor Qbs, a resistor R1, and a coupling capacitor Cin. The power-amplifying bipolar transistor Qout is emittergrounded. The bias bipolar transistor Qbs is an emitter-follower. The resistor R1 is disposed between the emitter of the bias bipolar transistor Qbs and the base of the power-amplifying bipolar transistor Qout. The coupling capacitor Cin couples the input power signal Pin to the base of the power-amplifying bipolar transistor Qout. The power-amplifying bipolar transistor Qout is, for example, an HBT (Heterojunction Bipolar Transistor). The resistor R1 plays a role, for instance, of preventing the input power signal Pin from leaking into the bias generation circuit BSGEN.

The bias generation circuit BSGEN includes a bias resistor Rb, a diode Db1, and a diode Db2, which are sequentially series-coupled between a supply node for the bias setup voltage Vb and a ground power supply voltage GND as viewed from a side toward the bias setup voltage Vb. The cathodes of the diodes Db1, Db2 are positioned toward the ground power supply voltage GND, and a signal is applied from a common coupling node of the anode of the diode Db1 and the bias resistor Rb toward the base of the bias bipolar transistor Qbs. The diodes Db1, Db2 are implemented, for instance, by a diode-coupled bipolar transistor. The diodes Db1, Db2 and the bias bipolar transistor Qbs play a role, for instance, of compensating for the temperature dependence of the power-amplifying bipolar transistor Qout. The bias bipolar transistor Qbs also plays a role, for instance, of preventing the supply of bias to the power-amplifying bipolar transistor Qout from becoming insufficient when the level of transmission power from the power-amplifying bipolar transistor Qout is high.

When the bias setup voltage Vb is applied while the above-described exemplary configuration is employed, a bias setup current Ib, which is mainly dependent on the resistor Rb, flows so that a bias current Iq, which reflects the magnitude of the bias setup current Ib, is set in the power-amplifying bipolar transistor Qout. In reality, however, the magnitude of the bias setup current Ib may deviate from its design value due, for instance, to the variations of the bias setup voltage Vb and the manufacturing variations of the resistor Rb and diodes Db1, Db2, thereby causing the bias current Iq to vary. As such being the case, the bias detection circuit SENS shown, for instance, in FIG. 3 is provided.

<Details of Bias Detection Circuit>

Figure 3:
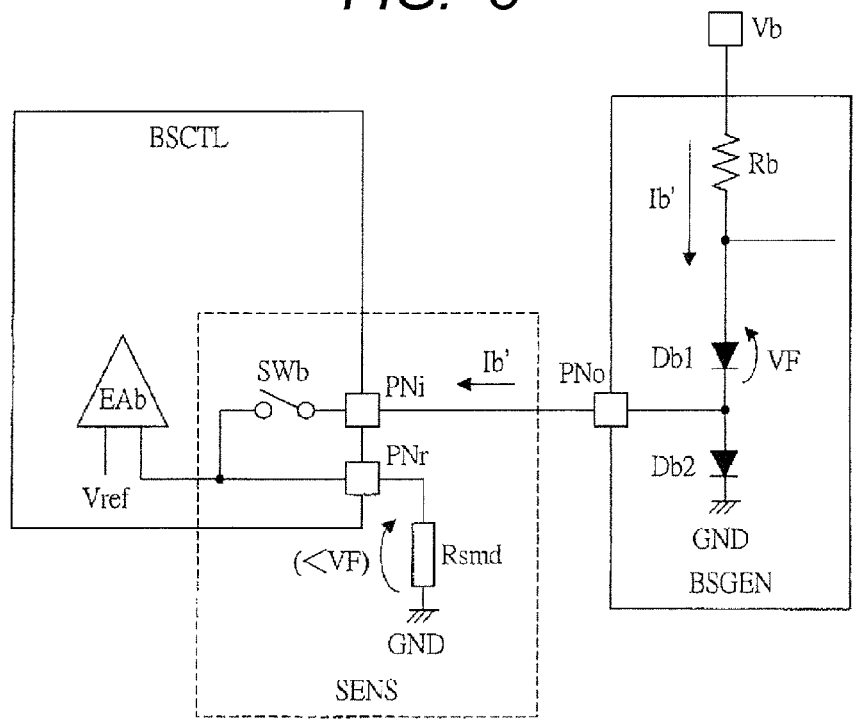
FIG. 3 is a circuit diagram illustrating in detail an exemplary configuration of a bias detection circuit included in the wireless communication device shown in FIGS. 1 and 2.

FIG. 3 is a circuit diagram illustrating in detail an exemplary configuration of the bias detection circuit included in the wireless communication device shown in FIGS. 1 and 2. The bias detection circuit SENS shown in FIG. 3 includes a switch SWb and a resistor Rsmd. The switch SWb is coupled at one end to the cathode of the diode Db1 (the anode of the diode Db2) in the bias generation circuit BSGEN and coupled at the other end to one of two inputs of the error amplifier EAb. The resistor Rsmd is coupled between one of the two inputs of the error amplifier EAb and the ground power supply voltage GND. It is preferred that a high-precision resistive element be used as the resistor Rsmd. From this point of view, an SMD (Surface Mount Device) external to the semiconductor chip is used.

Further, it is presumed that the bias control section BSCTL and the bias generation circuit BSGEN are implemented by another semiconductor chip. Therefore, the switch SWb is formed over a semiconductor chip for the bias control section BSCTL. Accordingly, the cathode of the diode Db1 is coupled to one end of the switch SWb through an external terminal PNo of the bias generation circuit BSGEN and through an external terminal PNi of the bias control section BSCTL, and the other end of the switch SWb is coupled to the resistor Rsmd through an external terminal PNr of the bias control section BSCTL.

If the forward voltage of the diodes Db1, Db2 is VF, the resistance value of the resistor Rsmd is set so that a voltage lower than VF is generated at one end (PNr) of the resistor Rsmd when the switch SWb is driven to ON. Therefore, when the bias setup voltage Vb is applied to the bias generation circuit BSGEN while the switch SWb is driven to ON, the diode Db2 becomes inactive (is placed in a substantially open state) so that a current Ib', which reflects the electrical characteristics of the diode Db1 and resistor Rb (and the resistor Rsmd), flows in a path in which the resistor Rb, diode Db1, switch SWb, and resistor Rsmd are disposed in the order named. As the resistance value of the resistor Rsmd is accurately preset, the current Ib' having a value reflecting the manufacturing variations of the resistor Rb and diode Db1 is obtained so that the value of the current Ib' is close to the value of the bias setup current Ib shown in FIG. 2.

Thus, variation corrections can be made when the current Ib' is converted to a voltage (Ib'×Rsmd) through the resistor Rsmd and compared to the reference voltage Vref by the error amplifier EAb. In other words, the variation corrections can be made by calculating in advance an ideal voltage that is developed at one end of the resistor Rsmd when the predetermined bias setup voltage Vb for testing is applied and by applying the calculated voltage as the reference voltage Vref in the earlier-described correction operation mode. It should also be noted that the switch SWb is driven to OFF in the normal operation mode.

The configuration of the bias detection circuit SENS is not limited to the example shown in FIG. 3 and can be changed as needed. For example, an alternative is to provide a semiconductor chip having the bias generation circuit BSGEN with a replica circuit in which the circuit configuration and process structure of the bias generation circuit are reflected and use the replica circuit for detection purposes. However, the use of the configuration shown in FIG. 3 is preferred in consideration of circuit size and of a slight error that actually occurs between the replica circuit and the bias generation circuit. Further, in some cases, the variation corrections can be made by detecting a voltage (e.g., the anode voltage of the diode Db1) instead of detecting a current without providing the resistor Rsmd. However, the use of the current detection method depicted in FIG. 3 is preferred from the viewpoint of variation correction accuracy enhancement. Moreover, it is obvious that the configurations of the bias generation circuit and high-frequency power amplifier are not limited to the examples shown in FIGS. 2 and 3. A bias detection circuit may be provided as needed in accordance with the configuration of each circuit.

<Overview of Bias Correction Operation>

Figure 4:
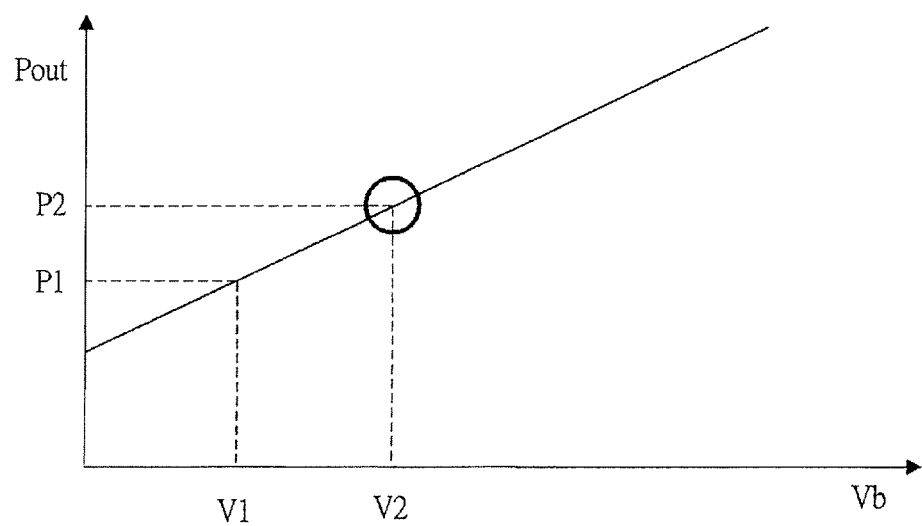
FIG. 4 is a diagram illustrating an exemplary relationship between a bias setup voltage and a transmission power level that prevails in the wireless communication device shown in FIG. 1.
Figure 5A:
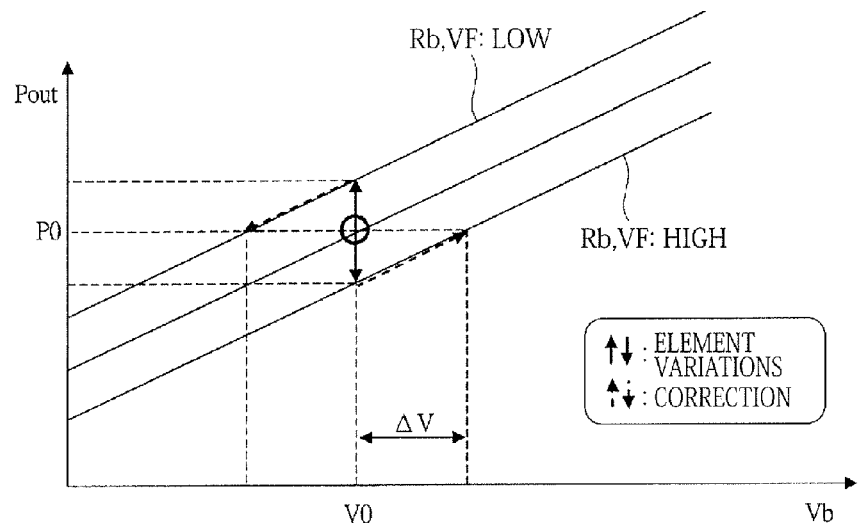
Figure 5B:
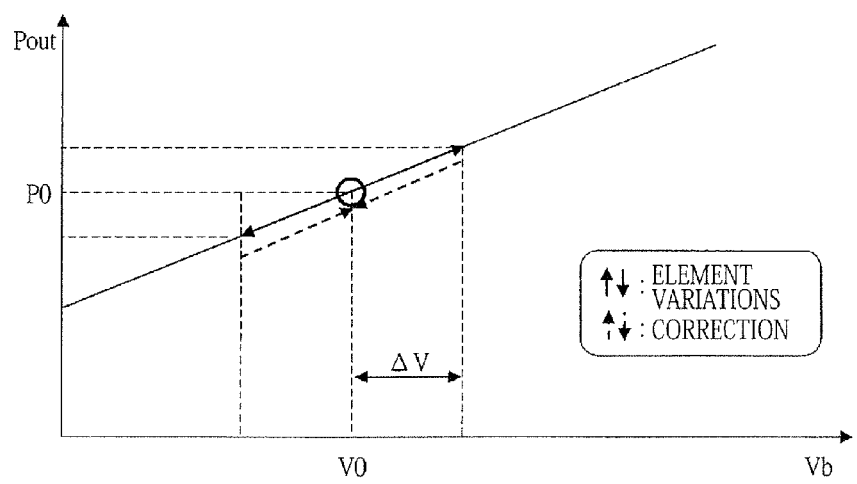

FIG. 4 is a diagram illustrating an exemplary relationship between the bias setup voltage and the transmission power level that prevails in the wireless communication device shown in FIG. 1. FIGS. 5A and 5B are diagrams illustrating corrections that are made when bias variations exist in the wireless communication device shown in FIGS. 1 and 4, in which FIG. 5A is a diagram illustrating a case where element variations exist in the bias generation circuit, and FIG. 5B is a diagram illustrating a case where the bias setup voltage varies. As shown, for instance, in FIG. 4, it is assumed that there is ideally a linear relationship between the bias setup voltage Vb and the transmission power level in the output power signal Pout.

As shown in FIG. 5A, if manufacturing variations exist in the element in the bias generation circuit BSGEN (resistor Rb and diodes Db1, Db2 in the example shown in FIG. 2), the operating point of the power-amplifying bipolar transistor Qout changes when a predetermined bias setup voltage (V0) is applied. As a result, the transmission power level (Pout) changes. If a variation correction method depicted in FIG. 1 is used, the error amplifier EAb detects the variations as a change in the bias setup current Ib' in the example shown, for instance, in FIG. 3 so that an offset of ΔV is added through the correction circuit CC (FIG. 1) to the predetermined bias setup voltage V0 to offset the amount of the change as shown in FIG. 5A. Consequently, the operating point of the power-amplifying bipolar transistor Qout becomes fixed so that the transmission power level (Pout) also becomes fixed (P0).

Further, if the bias setup voltage Vb itself varies ΔV from V0 as shown in FIG. 5B, the operating point of the power-amplifying bipolar transistor Qout changes to change the transmission power level (Pout). If, in this instance, the variation correction method depicted in FIG. 1 is used, the error amplifier EAb detects the variations as a change in the bias setup current Ib' in the example shown, for instance, in FIG. 3 so that an offset of ΔV of added through the correction circuit CC (FIG. 1) to offset the amount of the change as shown in FIG. 5B. As a result, the bias setup voltage Vb reverts to V0. Consequently, the operating point of the power-amplifying bipolar transistor Qout becomes fixed so that the transmission power level (Pout) also becomes fixed (P0).

<Wireless Communication Device Manufacturing Flow>

Figure 6:
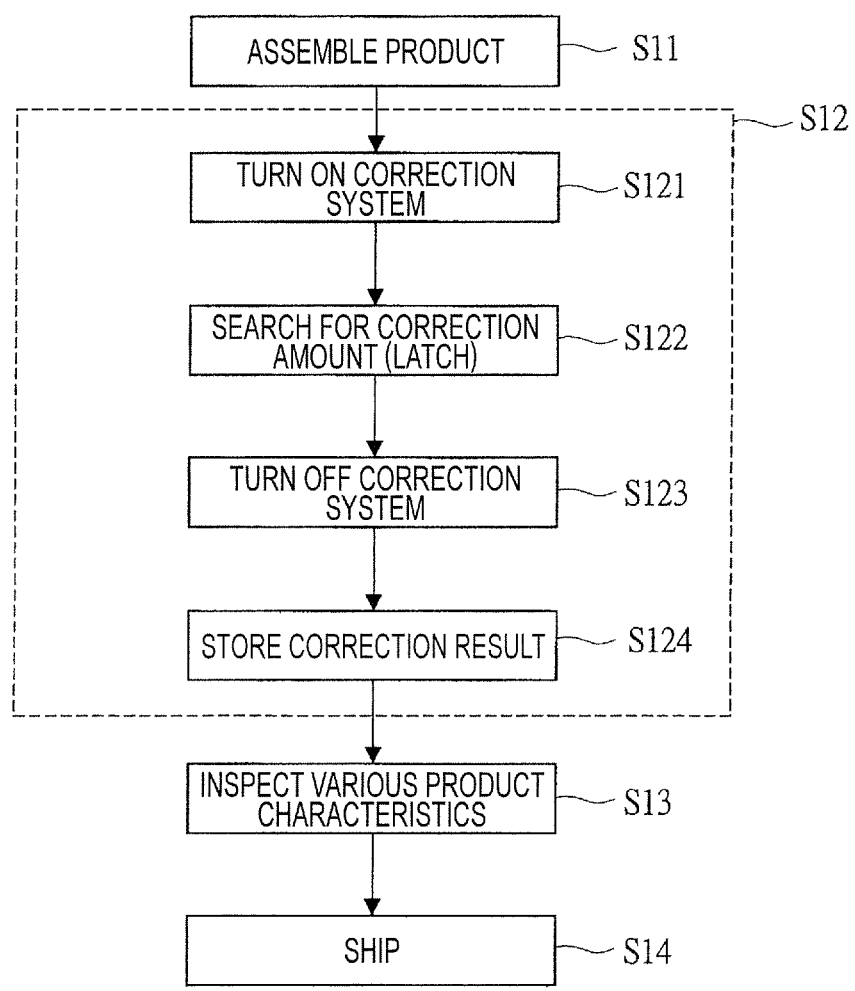
FIG. 6 is a flowchart illustrating an exemplary manufacturing process of the essential parts of the wireless communication device shown in FIG. 1.

FIG. 6 is a flowchart illustrating an exemplary manufacturing process of the essential parts of the wireless communication device shown in FIG. 1. Referring to FIG. 6, the bias control section BSCTL and the power amplifier section HPABK, which are shown in FIG. 1, are formed over semiconductor wafers during a preceding process (not shown). The bias control section BSCTL and the power amplifier section HPABK are formed over different semiconductor wafers although such a formation scheme need not always be employed. Subsequently, the semiconductor wafers are subjected, for instance, to a dicing process and separated into individual semiconductor chips. Next, in step S11, which is shown in FIG. 6, the semiconductor chips (bias control section BSCTL and power amplifier section HPABK) are mounted over a module wiring board (typically a ceramic wiring board). Then, in step S12, a bias correction process is performed.

In step S12, a correction system turns ON (step S121) to search for a correction amount (step S122). The correction system then turns OFF (step S123) to store the result of correction (step S124). More specifically, as described with reference to FIG. 1, the high-frequency system section RFSYS is placed in the correction operation mode to build the bias correction loop (step S121), and then the predetermined bias instruction code VBCD for testing and the associated reference voltage Vref are given, for instance, from an external inspection device. Hence, an optimum bit correction value ΔBC is searched for (step S122) to latch the result of the search. Subsequently, if, for instance, the bias control section BSCTL includes a nonvolatile memory as the memory MEM, the latched information is stored in the memory MEM (step S124). If, on the other hand, the bias control section BSCTL includes a different means (e.g., a fuse or a bonding wire) as the memory MEM, the latched information is first read by the external inspection device or the like and then reflected in a subsequent fuse cutting process or bonding wire process.

After the above-described bias correction process (step S12) is completed, the bias-corrected high-frequency system section RFSYS is inspected for predetermined electrical characteristics including the transmission power characteristics (step S13). Articles found to be nondefective as a result of inspection are shipped (step S14). In this instance, as the bias correction is made, it can be expected that the yield of the high-frequency system section RFSYS is increased. Subsequently, the high-frequency system section RFSYS is combined, for instance, with the baseband unit BBU by an assembly manufacturer as described earlier, and corrections are made in the manner depicted in FIG. 14. In this instance, the burden imposed on the assembly manufacturer can be decreased because the high-frequency system section RFSYS is bias-corrected.

As described above, using the wireless communication device according to the first embodiment typically makes it possible to improve the transmission power characteristics and reduce the resources required for improving the transmission power characteristics.

Second Embodiment

Overview of Essential Parts of Wireless Communication Device

First Modification Example

Figure 7:
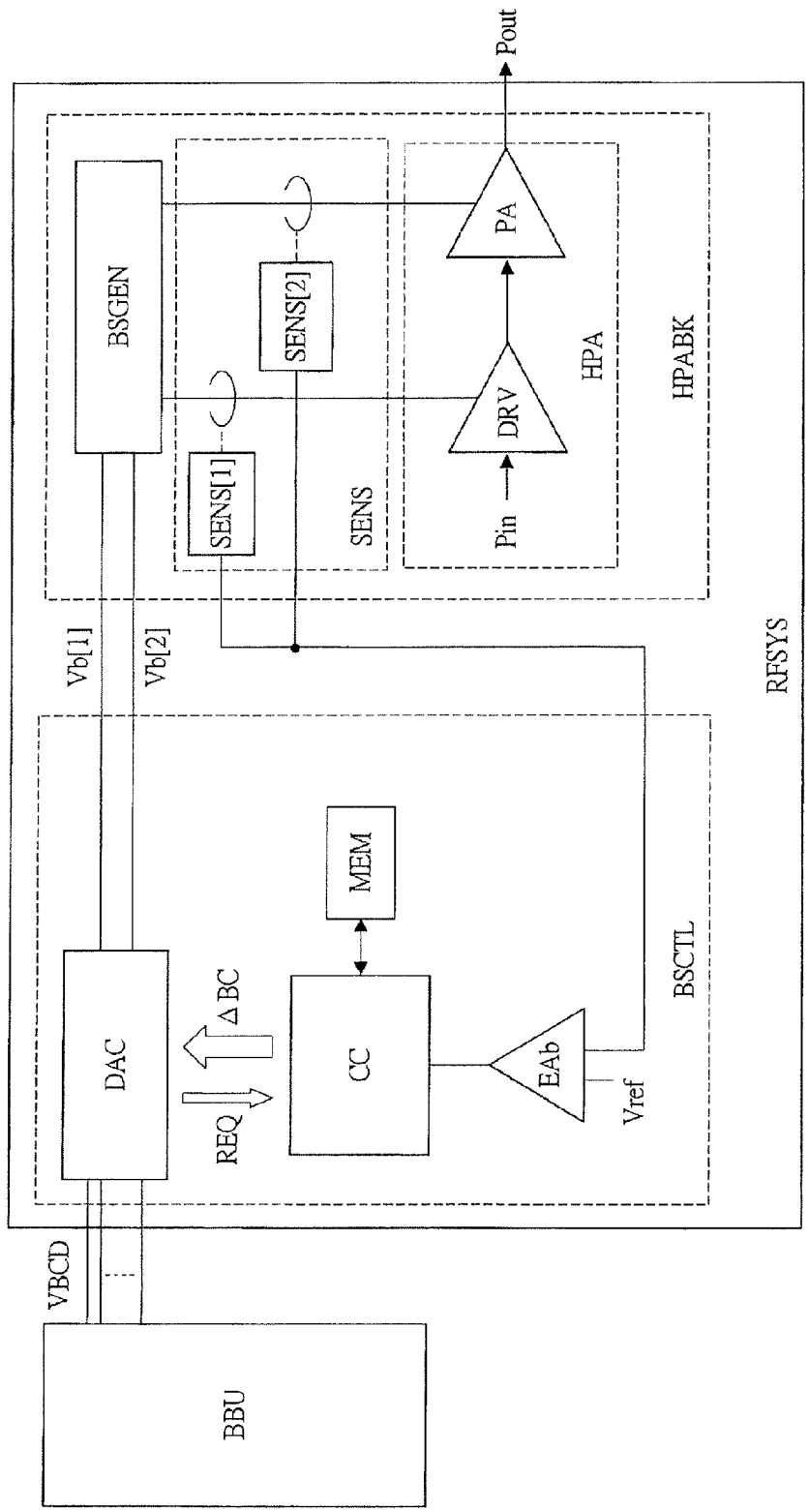
FIG. 7 is a schematic block diagram illustrating an exemplary configuration of the essential parts of the wireless communication device according to a second embodiment of the present invention.

FIG. 7 is a schematic block diagram illustrating an exemplary configuration of the essential parts of the wireless communication device according to a second embodiment of the present invention. The configuration of the wireless communication device shown in FIG. 7 differs from the exemplary configuration shown in FIG. 1 in that the high-frequency power amplifier HPA includes two cascade-coupled circuits, and that two bias detection circuits SENS[1], SENS[2] are provided accordingly, and further that the digital-to-analog conversion circuit DAC outputs two different bias setup voltages Vb[1], Vb[2]. Two different bias instruction codes VBCD, which respectively correspond to the bias setup voltages Vb[1], Vb[2], are input into the digital-to-analog conversion circuit DAC. The high-frequency power amplifier HPA includes a driver circuit DRV and a power amplifier circuit PA. The driver circuit DRV receives the input power signal Pin. The power amplifier circuit PA is disposed downstream of the driver circuit DRV to output the output power signal Pout. The bias generation circuit BSGEN supplies a bias to the driver circuit DRV in accordance with the bias setup voltage Vb[1] and supplies a bias to the power amplifier circuit PA in accordance with the bias setup voltage Vb[2]. The bias detection circuit SENS[1] detects the bias of the driver circuit DRV, whereas the bias detection circuit SENS[2] detects the bias of the power amplifier circuit PA.

Details of Bias Detection Circuit

First Modification Example

Figure 8:
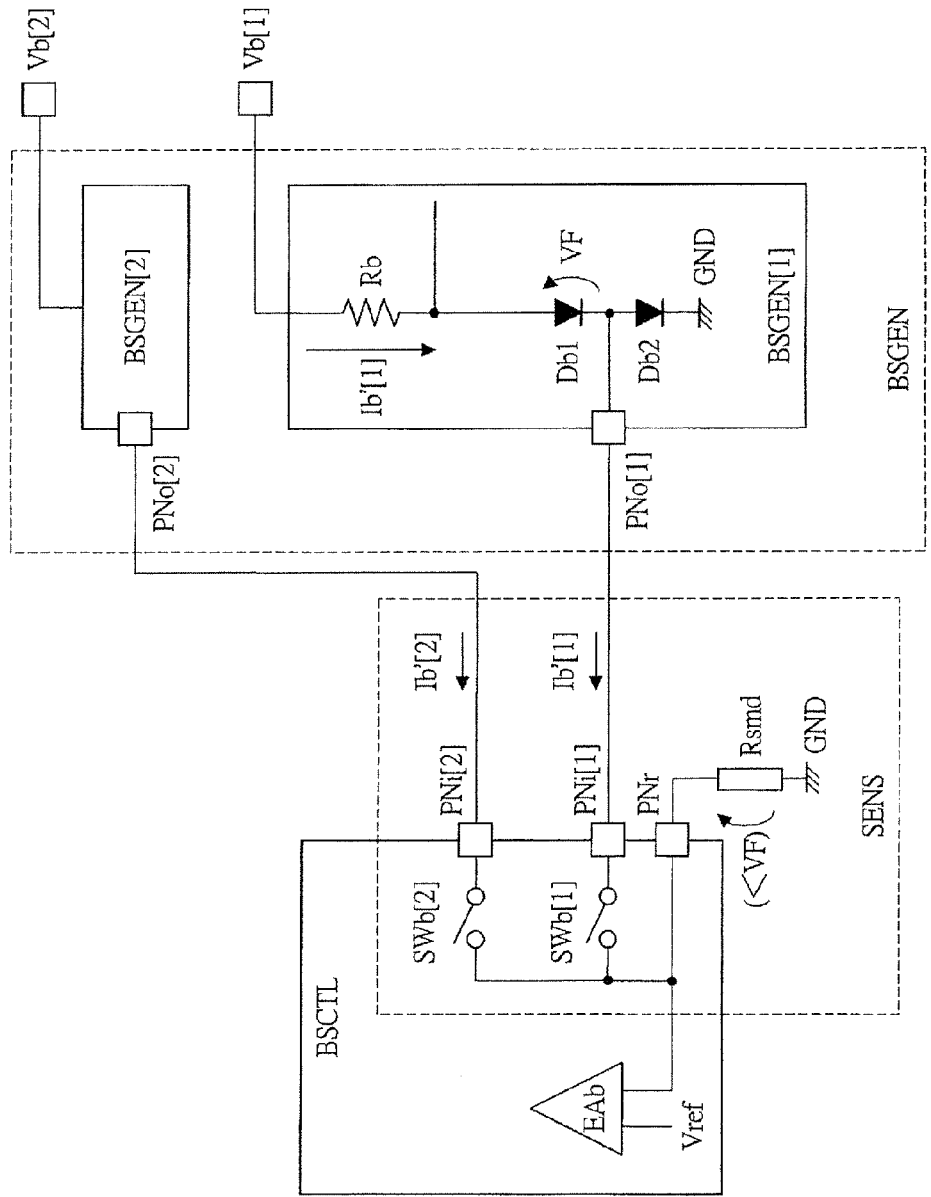
FIG. 8 is a circuit diagram illustrating in detail an exemplary configuration of the bias detection circuit and its neighboring circuits included in the wireless communication device shown in FIG. 7.

FIG. 8 is a circuit diagram illustrating in detail an exemplary configuration of the bias detection circuit and its neighboring circuits included in the wireless communication device shown in FIG. 7. The exemplary configuration shown in FIG. 8 is obtained by extending the exemplary configuration shown in FIG. 3. The bias generation circuit BSGEN includes two bias generation circuits BSGEN[1], BSGEN[2], which each have a circuit shown in FIG. 3. The bias generation circuit BSGEN[1] operates upon receipt of the bias setup voltage Vb[1]. The bias generation circuit BSGEN[2] operates upon receipt of the bias setup voltage Vb[2]. The bias detection circuit SENS shown in FIG. 8 is configured so that one ends of two switches SWb[1], SWb[2] are commonly coupled to one end (external terminal PNr) of the resistor Rsmd, which has been described with reference to FIG. 3. The other end of the switch SWb[1] is coupled to one ends of the aforementioned diodes through an external terminal PNi[1] of the bias control section BSCTL and through an external terminal PNo[1] of the bias generation circuit BSGEN[1]. The other end of the switch SWb[2] is coupled to one ends of the aforementioned diodes through an external terminal PNi[2] of the bias control section BSCTL and through an external terminal PNo[2] of the bias generation circuit BSGEN[2].

When the above-described exemplary configuration is used to drive the switch SWb[1]/SWb[2] to ON/OFF in the aforementioned correction operation mode while the predetermined bias setup voltage Vb[1] for testing and the associated reference voltage Vref are applied, the bias of the driver circuit DRV can be corrected in accordance with a current Ib'[1] that flows in the bias generation circuit BSGEN[1]. Similarly, when the switch SWb[1]/SWb[2] is driven to ON/OFF while the predetermined bias setup voltage Vb[2] for testing and the associated reference voltage Vref are applied, the bias of the power amplifier circuit PA can be corrected in accordance with a current Ib'[2] that flows in the bias generation circuit BSGEN[2]. In this instance, the resistor Rsmd can be shared by choosing between the switches SWb[1], SWb[2]. Therefore, an increase in circuit size (resources) can be suppressed.

Figure 9:
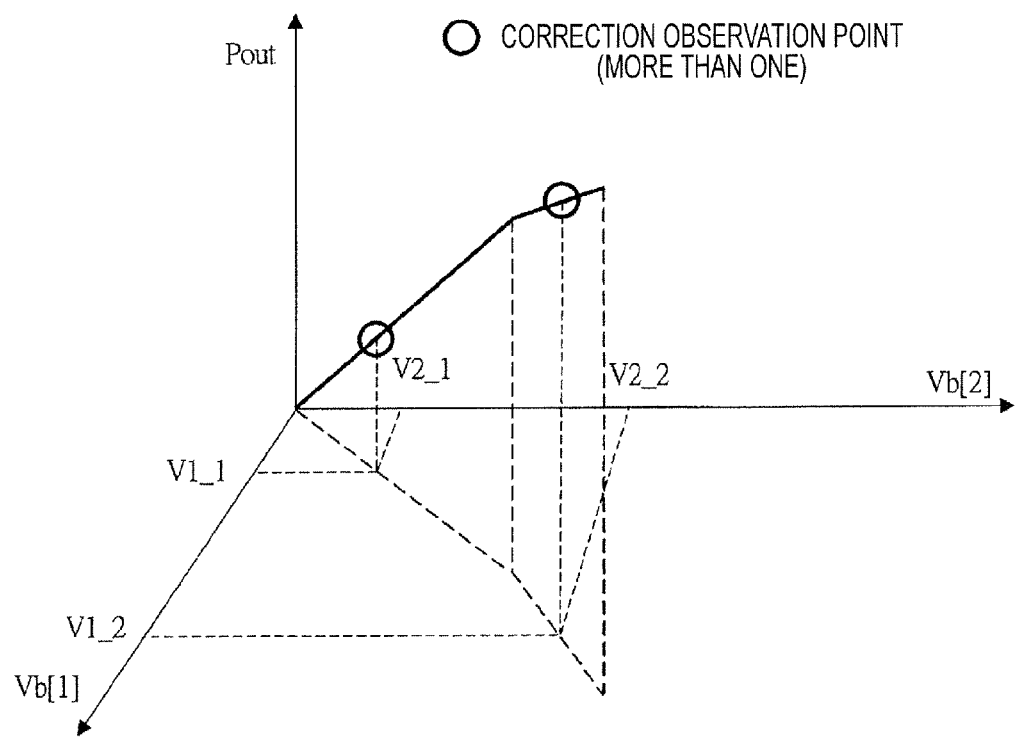
FIG. 9 is a diagram illustrating an exemplary operation performed for bias correction in the wireless communication device shown in FIG. 7.

FIG. 9 is a diagram illustrating an exemplary operation performed for bias correction in the wireless communication device shown in FIG. 7. When, for instance, there is one correction observation point for each bias setup voltage Vb (Vb[1], Vb[2]), the amount of actual bias change with respect to a change in the bias setup voltage Vb may vary in accordance, for instance, with discrepancy in the balance of the characteristics of individual elements in the bias generation circuit BSGEN or with discrepancy in the linear characteristics of the digital-to-analog conversion circuit DAC. For example, the relational expression between the bias setup voltage Vb[1] and current Ib'[1] in FIG. 8 may deviate from desired characteristics. As such being the case, a plurality of correction observation points are provided for each bias setup voltage Vb. This makes it possible to correct the relational expression between the bias setup voltage Vb and an actual bias.

In the example shown in FIG. 9, the bias setup voltage Vb[1] is corrected so that an actual bias (its reflection value (Ib'[1] in FIG. 8)) obtained when the value of bias setup voltage Vb[1] is set at correction observation point V1_1 and an actual bias (its reflection value) obtained when the value of bias setup voltage Vb[1] is set at correction observation point V1_2 respectively coincide with predetermined values. Similarly, the bias setup voltage Vb[2] is corrected so that an actual bias (its reflection value (Ib'[2] in FIG. 8)) obtained when the value of bias setup voltage Vb[2] is set at correction observation point V2_1 and an actual bias (its reflection value) obtained when the value of bias setup voltage Vb[2] is set at correction observation point V2_2 respectively coincide with predetermined values. In reality, the correlation table is created to specify the amount of correction to be applied to the setting of each bias setup voltage Vb (bias instruction code VBCD), and then the values of the correlation table are determined by the aforementioned correction and stored in the memory MEM to correct the above-mentioned relational expression. The example shown in FIG. 9 is depicted on the presumption that the transmission power level (Pout) is unambiguously determined by an actual bias.

As described above, using the wireless communication device according to the second embodiment makes it possible to not only provide the various advantages described in conjunction with the first embodiment, but also suppress an increase in the resources required for the improvement of transmission power characteristics by commonalizing, for example, the bias detection circuit (resistor Rsmd) and error amplifier EAb even when the high-frequency power amplifier HPA includes a plurality of circuits. Further, the accuracy of the relationship between the bias instruction code VBCD and the transmission power level can be enhanced by adopting a plurality of correction observation points.

Third Embodiment

Overview of Essential Parts of Wireless Communication Device

Second Modification Example

Figure 10:
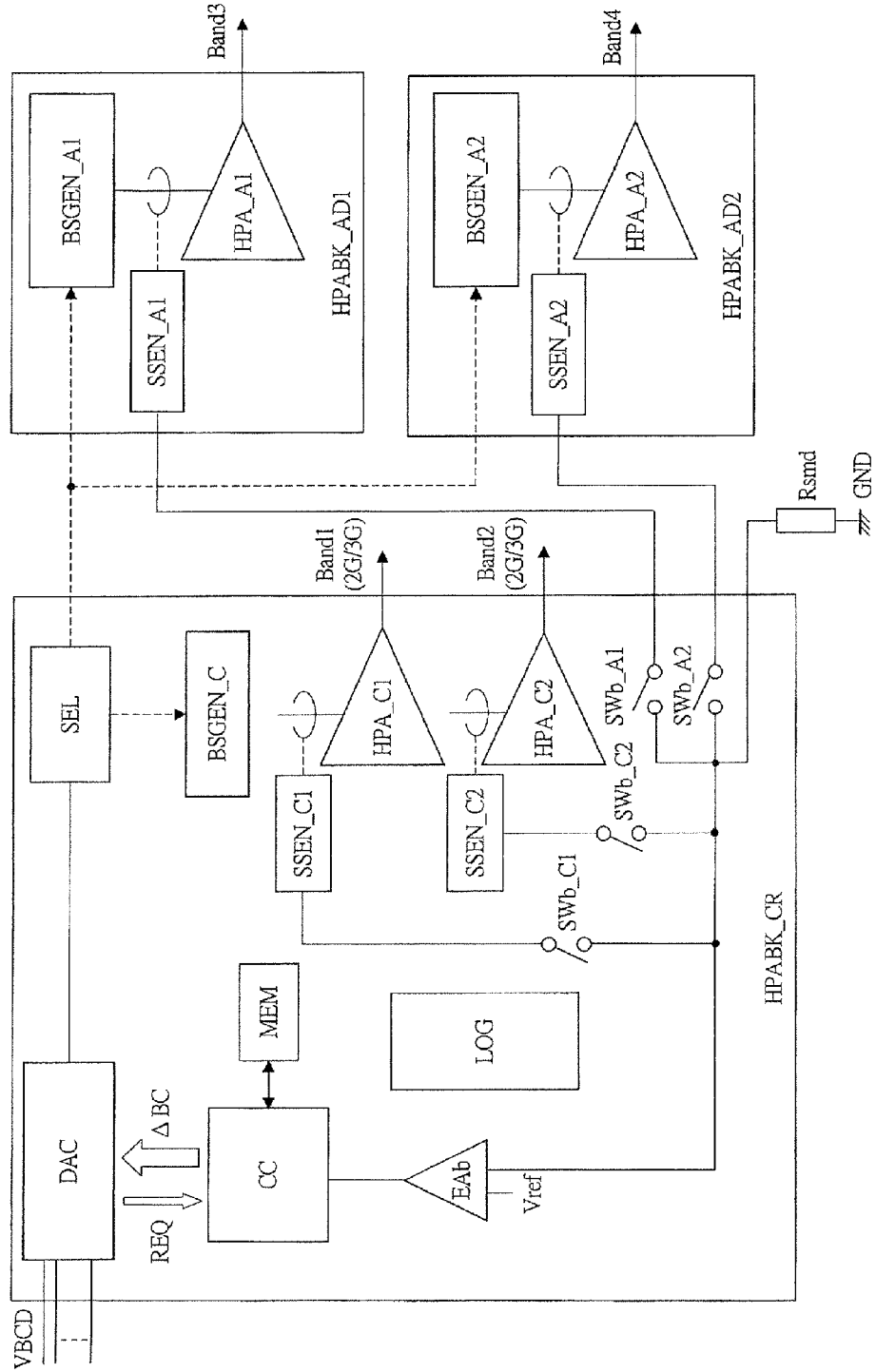
FIG. 10 is a schematic block diagram illustrating an exemplary configuration of the essential parts of the wireless communication device according to a third embodiment of the present invention.

FIG. 10 is a schematic block diagram illustrating an exemplary configuration of the essential parts of the wireless communication device according to a third embodiment of the present invention. The wireless communication device shown in FIG. 10 includes a core power amplifier section HPABK_CR and additional power amplifier sections HPABK_AD1, HPABK_AD2. The power amplifier sections are implemented by different semiconductor chips and mounted over the same system wiring board (typically a ceramic wiring board). The core power amplifier section HPABK_CR includes a collection of multi-mode, multi-band high-frequency power amplifiers that are applicable to frequently-used international frequency bands and communication methods such as GSM (registered trademark) (Global System for Mobile Communications) (so-called 2G), W-CDMA (so-called 3G), and LTE. Meanwhile, the additional power amplifier sections HPABK_AD1, HPABK_AD2 each include a high-frequency power amplifier applicable to a frequency band and communication method that are not applicable to the core power amplifier section HPABK_CR, and is provided, for instance, to handle a region-specific frequency band.

The core power amplifier section HPABK_CR includes the digital-to-analog conversion circuit DAC, the correction circuit CC, the memory MEM, and the error amplifier EAb, which are described in conjunction with the bias control section BSCTL shown in FIG. 1. In addition, the core power amplifier section HPABK_CR also includes a selection circuit SEL, a bias generation circuit BSGEN_C, high-frequency power amplifiers HPA_C1, HPA_C2, bias detection sub-circuits SSEN_C1, SSEN_C2, a control logic circuit LOG, and switches SWb_C1, SWb_C2, SWb_A1, SWb_A2.

The selection circuit SEL receives an output signal (bias setup voltage Vb) from the digital-to-analog conversion circuit DAC and outputs the received signal to either the bias generation circuit BSGEN_C or the additional power amplifier sections HPABK_AD1, HPABK_AD2. The bias generation circuit BSGEN_C supplies a bias to the high-frequency power amplifier HPA_C1 and to the high-frequency power amplifier HPA_C2. The bias detection sub-circuit SSEN_C1 detects the bias supplied to the high-frequency power amplifier HPA_C1, and the bias detection sub-circuit SSEN_C2 detects the bias supplied to the high-frequency power amplifier HPA_C2. The result of detection by the bias detection sub-circuit SSEN_C1 (e.g., a current) is supplied to an externally coupled, common resistor Rsmd through the switch SWb_C1, and the voltage equivalent of the supplied detection result is input into the error amplifier EAb. Similarly, the result of detection by the bias detection sub-circuit SSEN_C2 (e.g., a current) is supplied to the common resistor Rsmd through the switch SWb_C2, and the voltage equivalent of the supplied detection result is input into the error amplifier EAb.

The control logic circuit LOG performs, for example, a process of selecting a high-frequency power amplifier to be used (and determining the choice to be made by the selection circuit SEL) and deactivating an unselected high-frequency power amplifier in accordance with an instruction from a baseband unit (not shown). Further, the control logic circuit LOG exercises control in the correction operation mode to turn ON one of the switches SWb_C1, SWb_C2, SWb_A1, SWb_A2, and exercises control in the normal operation mode to turn OFF all the switches SWb_C1, SWb_C2, SWb_A1, SWb_A2. In the example shown, for instance, in FIG. 3, the bias detection sub-circuits SSEN_C1, SSEN_C2 each correspond to the wiring between one end of a switch SWb and one end of a diode. As described above, the core power amplifier section HPABK_CR is configured to perform the functions of both the bias control section BSCTL and power amplifier section HPABK shown in FIG. 1, and operates in the same manner as described in conjunction with the first or second embodiment to respectively correct the biases of the high-frequency power amplifiers HPA_C1, HPA_C2.

The additional power amplifier section HPABK_AD1 includes a bias generation circuit BSGEN_A1, a high-frequency power amplifier HPA_A1, and a bias detection sub-circuit SSEN_A1. The result of detection by the bias detection sub-circuit SSEN_A1 (e.g., a current) is input into the core power amplifier section HPABK_CR and supplied to the common resistor Rsmd through the switch SWb_A1 in the core power amplifier section HPABK_CR so that its voltage equivalent is input into the error amplifier EAb. Similarly, the additional power amplifier section HPABK_AD2 includes a bias generation circuit BSGEN_A2, a high-frequency power amplifier HPA_A2, and a bias detection sub-circuit SSEN_A2. The result of detection by the bias detection sub-circuit SSEN_A2 (e.g., a current) is input into the core power amplifier section HPABK_CR and supplied to the common resistor Rsmd through the switch SWb_A2 in the core power amplifier section HPABK_CR so that its voltage equivalent is input into the error amplifier EAb.

When, as described above, the core power amplifier section HPABK_CR incorporates the bias control section BSCTL shown in FIG. 1 so that the bias control section BSCTL is commonly used by the high-frequency power amplifier in the core power amplifier section HPABK_CR and by the high-frequency power amplifiers in the additional power amplifier sections HPABK_AD1, HPABK_AD2, the bias of each high-frequency power amplifier can be corrected with a small amount of resources (circuit size, etc.). Further, the core power amplifier section HPABK_CR initially includes a nonvolatile memory in some cases. In such cases, an increase in the amount of resources can be suppressed when the memory MEM is implemented by such a nonvolatile memory.

Fourth Embodiment

Overview of Essential Parts of Wireless Communication Device

Third Modification Example

Figure 11:
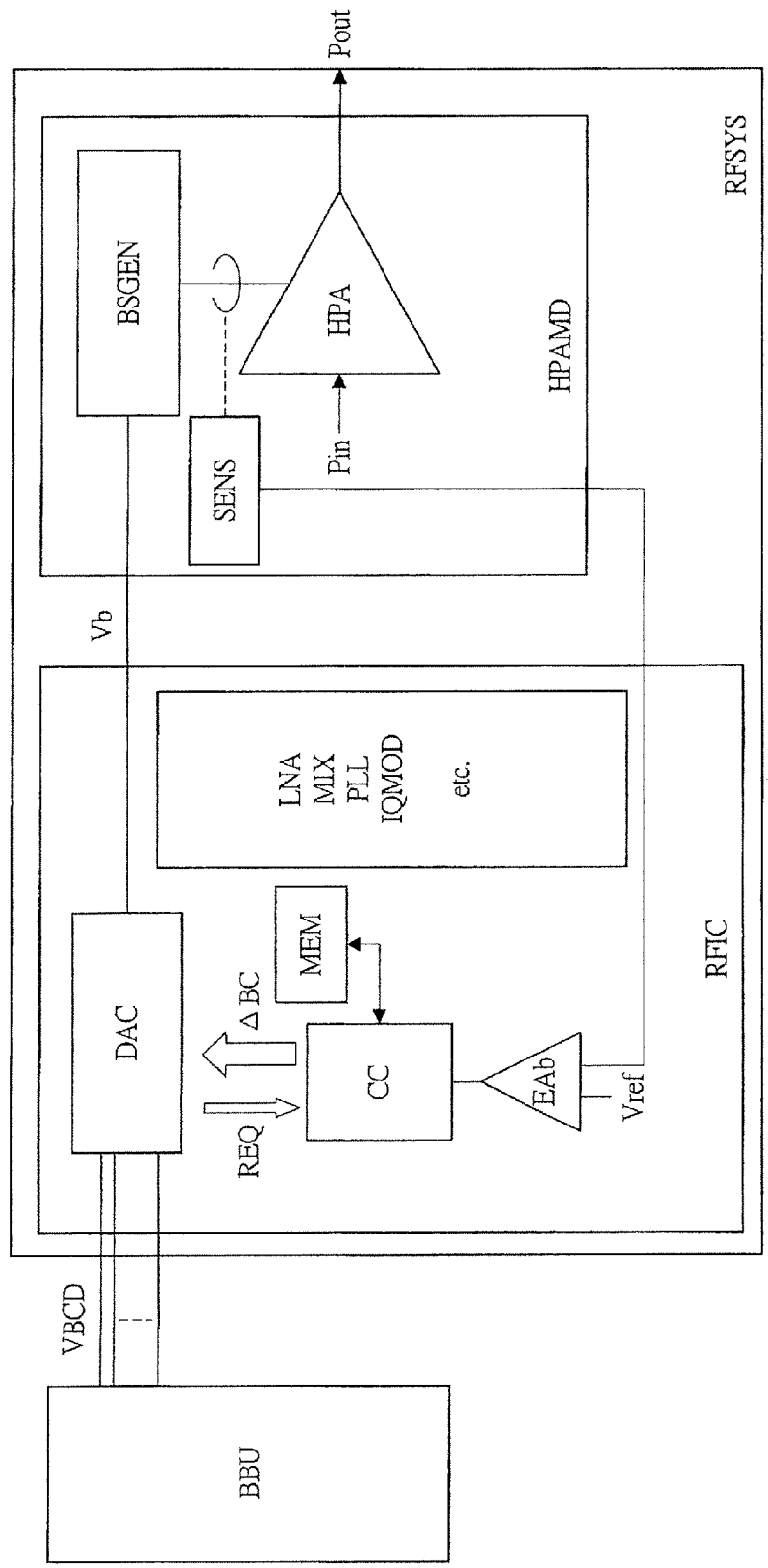
FIG. 11 is a schematic block diagram illustrating an exemplary configuration of the essential parts of the wireless communication device according to a fourth embodiment of the present invention.

FIG. 11 is a schematic block diagram illustrating an exemplary configuration of the essential parts of the wireless communication device according to a fourth embodiment of the present invention. The configuration of the wireless communication device shown in FIG. 11 differs from the exemplary configuration shown in FIG. 1 in that the power amplifier section HPABK is implemented by a high-frequency power amplifier module HPAMD shown in FIG. 11, and that the bias control section BSCTL shown in FIG. 1 is implemented by a high-frequency signal processor RFIC shown in FIG. 11. The high-frequency power amplifier module HPAMD is implemented by a module wiring board. Mounted over the module wiring board are a semiconductor chip, in which the high-frequency power amplifier HPA, the bias generation circuit BSGEN, and the bias detection circuit SENS are formed, and various parts (not shown), which are disposed in an output path of the high-frequency power amplifier HPA. The various parts typically include an output matching circuit, a directional coupler for detecting the transmission power level of the high-frequency power amplifier HPA, and a diplexer for separating an outgoing signal from an incoming signal in accordance with a frequency band.

The high-frequency signal processor RFIC is implemented, for instance, by a semiconductor chip, and includes, for example, a low-noise amplifier circuit LNA, a transmission/reception mixer circuit MIX, a phase-locked loop circuit PLL, an orthogonal modulator/orthogonal demodulator IQMOD in addition to various circuits that from the bias control section BSCTL shown in FIG. 1. The low-noise amplifier circuit LNA amplifies an incoming signal from an antenna (not shown). The orthogonal demodulator IQMOD is implemented, for instance, by two reception mixer circuits MIX. More specifically, it is implemented when each mixer circuit uses local oscillator signals, which are generated by the phase-locked loop circuit PLL and different in phase by 90 degrees, to down-convert (frequency-convert) an output signal of the low-noise amplifier circuit LNA to a baseband signal. Similarly, the orthogonal modulator IQMOD is implemented, for instance, by two transmission mixer circuits MIX. More specifically, it is implemented when each mixer circuit uses local oscillator signals, which are generated by the phase-locked loop circuit PLL and different in phase by 90 degrees, to up-convert (frequency-convert) orthogonal baseband signals (I signal and Q signal) and vector-synthesize the results of conversion.

The above-described high-frequency signal processor RFIC has been made highly functional in recent years. In some cases, it incorporates a nonvolatile memory. In such cases, an increase in the amount of resources can be suppressed when the memory MEM is implemented by the nonvolatile memory.

Fifth Embodiment

Overview of Essential Parts of Wireless Communication Device

Fourth Modification Example

Figure 12:
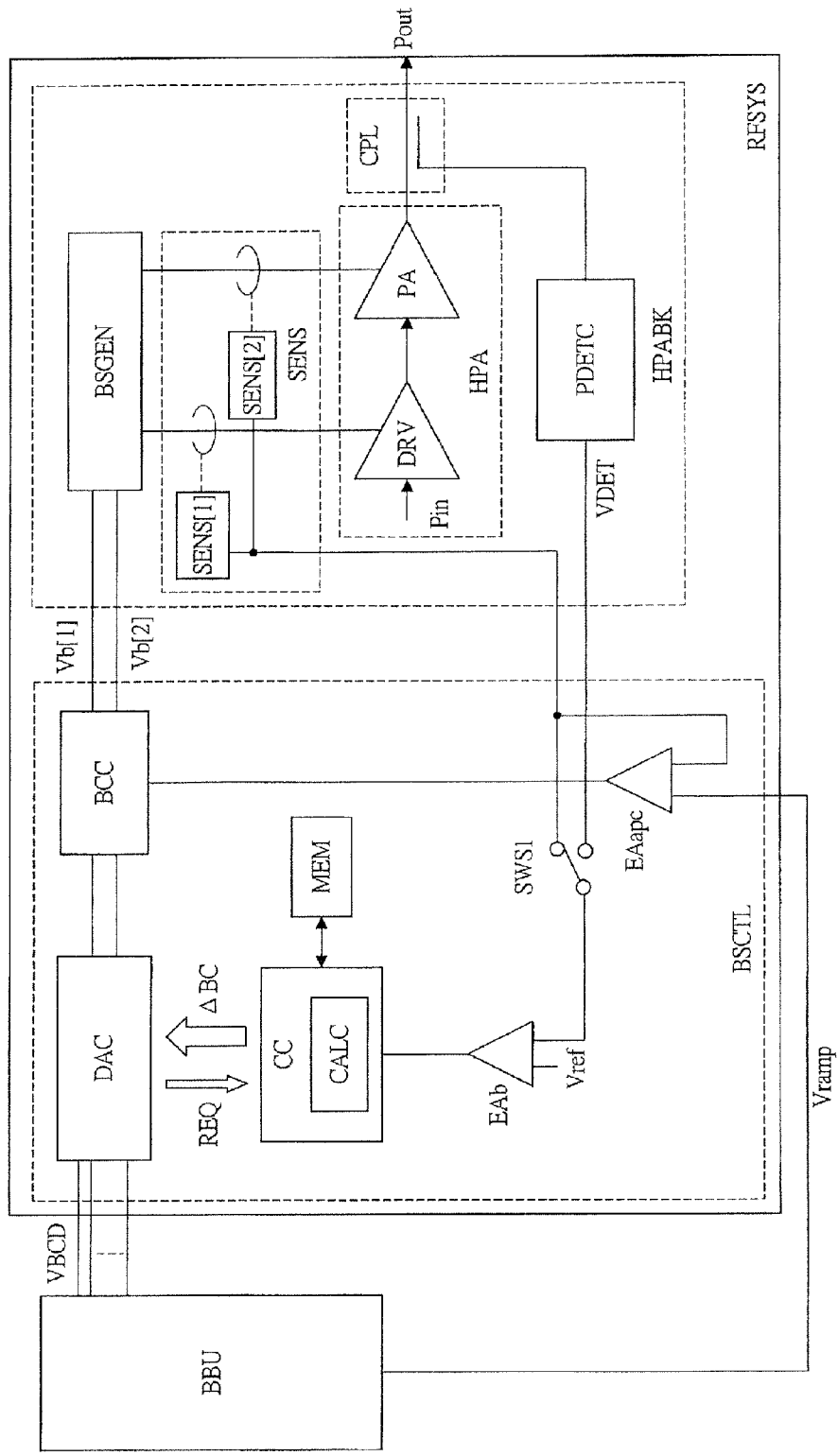
FIG. 12 is a schematic block diagram illustrating an exemplary configuration of the essential parts of the wireless communication device according to a fifth embodiment of the present invention.

FIG. 12 is a schematic block diagram illustrating an exemplary configuration of the essential parts of the wireless communication device according to a fifth embodiment of the present invention. The configuration of the wireless communication device shown in FIG. 12 differs from the exemplary configuration shown in FIG. 7 in that the power amplifier section HPABK additionally includes a directional coupler CPL and a power detection circuit PDETC, and that the bias control section BSCTL additionally includes a selector switch SWS1, an error amplifier EAapc, and a bias correction circuit BCC. The directional coupler CPL detects the output power of the power amplifier circuit PA, whereas the power detection circuit PDETC detects the magnitude of the output power detected by the directional coupler CPL and outputs a detected voltage signal VDET having a voltage value proportional to the detected magnitude.

The error amplifier EAapc amplifies the error between the detected voltage signal VDET and a power instruction signal Vramp from the baseband unit BBU, and the bias correction circuit BCC automatically adjusts the bias setup voltages Vb[1], Vb[2] so as to reduce the error. A loop that, as described above, starts at the bias correction circuit BCC, continues through the bias generation circuit BSGEN, the high-frequency power amplifier HPA, the coupler CPL, the power detection circuit PDETC, and the error amplifier EAapc, and returns to the bias correction circuit BCC is called, for example, an APC (Automatic Power Control) loop, and is widely used, for instance, in GSM (registered trademark) mobile phones. The selector switch SWS1 chooses whether the input into the error amplifier EAb is to be received from the bias detection circuits SENS[1], SENS[2], which are described with reference to FIG. 7, or is the detected voltage signal VDET. When the choice indicates that the detected voltage signal VDET is to be input into the error amplifier EAb, a power correction loop, which starts at the digital-to-analog conversion circuit DAC, continues through the bias generation circuit BSGEN, the high-frequency power amplifier HPA, the coupler CPL, the power detection circuit PDETC, the error amplifier EAb, and the correction circuit CC, and returns to the digital-to-analog conversion circuit DAC, is formed.

In the above-described exemplary configuration, at first, the selector switch SWS1 is placed in a bias detection circuit position so as to correct the bias with the bias correction loop described so far. The selector switch SWS1 is then moved into a detected voltage signal VDET position so as to correct the power with the power correction loop. More specifically, first of all, the bias correction loop determines a first correction amount, which is to be applied to the bias setup voltage output from the digital-to-analog conversion circuit DAC so that a predetermined relationship prevails between the bias instruction code VBCD to the digital-to-analog conversion circuit DAC and an actually supplied bias (e.g., Ib' in FIG. 3).

A first correlation table, which shows the relationship between the bias instruction code VBCD, the bias setup voltage, and the first correction amount to be applied to the bias setup voltage, is then obtained. When a certain bias instruction code VBCD is received in the normal operation mode, referencing the first correlation table makes it possible to acquire a first-corrected bias voltage (=V1+ΔV1), which is obtained by adding the first correction amount (ΔV1) to a predetermined bias setup voltage (V1). The first correction amount (ΔV1) represents the variations of the digital-to-analog conversion circuit DAC and of the bias generation circuit BSGEN.

In the power correction loop, for example, the amount of change in the detected voltage signal VDET is observed while the bias-corrected bias setup voltage (the first-corrected bias setup voltage) is changed in a state where the input power signal Pin at a fixed power level is input. In this instance, a reference voltage Vref appropriate for a change in the first-corrected bias setup voltage is applied in accordance with an ideal relationship between the first-corrected bias setup voltage and the detected voltage signal VDET so that the correction circuit CC determines a second correction amount, which is to be applied to the digital-to-analog conversion circuit DAC in order to eliminate the error between the reference voltage Vref and the detected voltage signal VDET.

Consequently, a second correlation table indicative of the relationship between the first-corrected bias voltage and the second correction amount to be applied to the first-corrected bias voltage is obtained. Referencing the second correlation table when a certain first-corrected bias setup voltage (=V1+ ΔV1) is received in the normal operation mode results in the acquisition of a second-corrected bias setup voltage (=V1+ ΔV1+ΔV2), which is obtained by adding the second correction amount (ΔV2) to the first-corrected bias setup voltage. The second-corrected bias setup voltage is then output as a final bias setup voltage Vb. In this instance, the second correction amount (ΔV2) represents the variations of the high-frequency power amplifier HPA, of the coupler CPL, and of the power detection circuit PDETC.

The correction circuit CC shown in FIG. 12 includes a calculation section CALC in order to perform a correction process while referencing the above-mentioned first correlation table and second correlation table. When the second correlation table is to be created, the optimum correction parameters can be obtained with ease through the use of limited resources because variation factors are already reduced by bias variation corrections. When the variations of the transmission power and of the associated detected power are corrected in addition to the bias variation corrections as described above, for example, the following advantages are obtained in addition to the various advantages described with reference to FIG. 1.

First of all, the burden imposed on the assembly manufacturer is decreased because the variation factors are further reduced when the overall system is to be corrected by the earlier-described method depicted, for instance, in FIG. 14. Further, as the variations of the transmission power level can be corrected to a certain extent, the yield of the power amplifier section (semiconductor chip) can be further increased although the correction burden imposed on the parts manufacturer slightly increases.

When, for instance, W-CDMA or LTE is used, the detected voltage signal VDET is reflected, for instance, in the gain of a variable-gain amplifier circuit (not shown) disposed upstream of the high-frequency power amplifier HPA, which outputs the input power signal Pin. However, when, for instance, GSM (registered trademark) is used, the detected voltage signal VDET is reflected in an APC loop, which is formed inside the power correction loop, as shown in FIG. 12. In the APC loop, the aforementioned first and second corrections may not be reflected because the bias correction circuit BCC automatically adjusts the bias voltage to ensure that the power instruction signal Vramp coincides with the detected voltage signal VDET. In the above instance, for example, the bias correction circuit BCC should be offset with respect to the relationship between the output of the error amplifier EAapc and the bias setup voltages Vb[1], Vb[2] in accordance with the aforementioned first and second corrections.

Sixth Embodiment

Overview of Essential Parts of Wireless Communication Device

Fifth Modification Example

Figure 13:
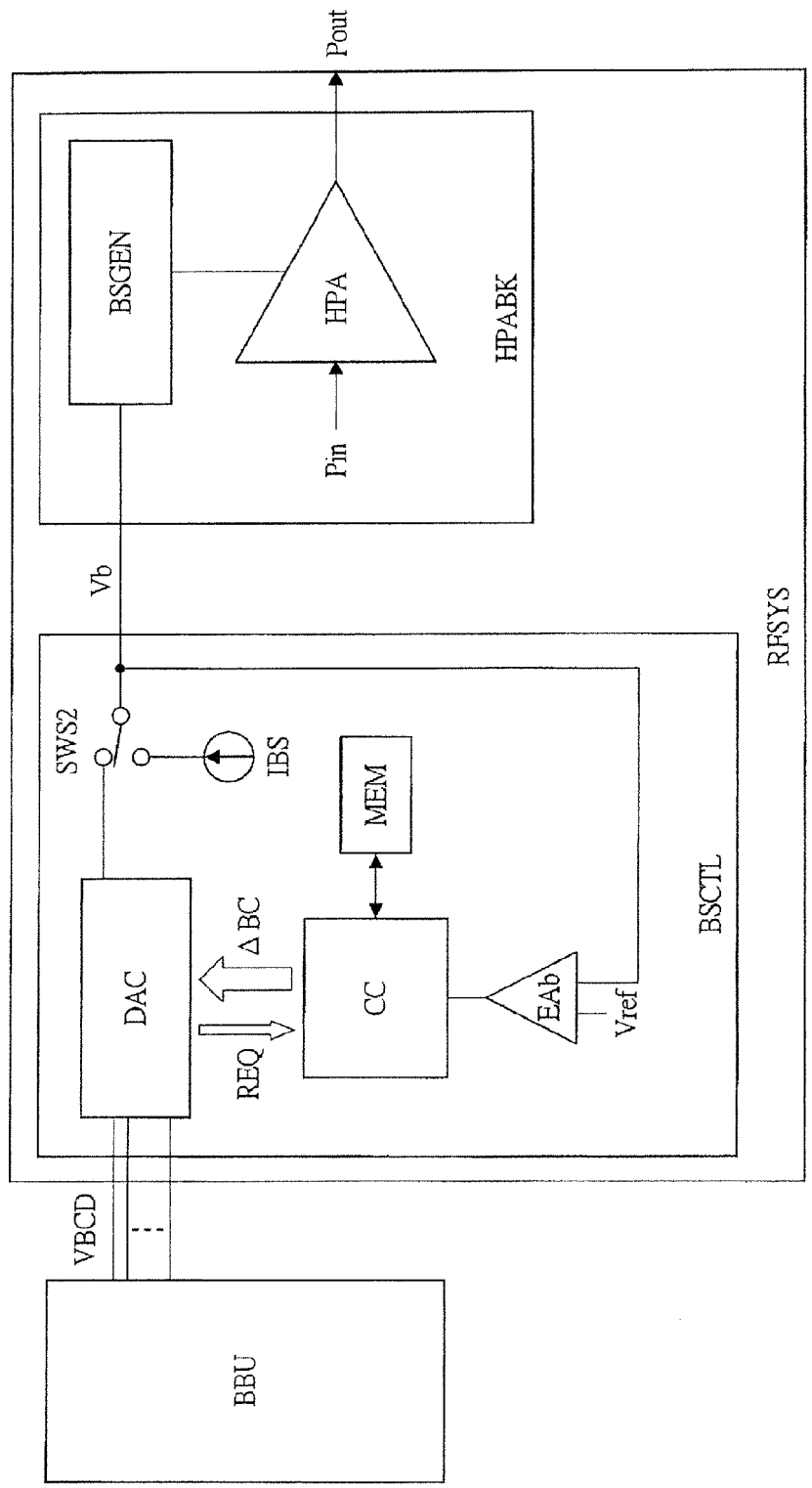
FIG. 13 is a schematic block diagram illustrating an exemplary configuration of the essential parts of the wireless communication device according to a sixth embodiment of the present invention.

FIG. 13 is a schematic block diagram illustrating an exemplary configuration of the essential parts of the wireless communication device according to a sixth embodiment of the present invention. The configuration of the wireless communication device shown in FIG. 13 differs from the exemplary configuration shown in FIG. 1 in that the bias detection circuit in the power amplifier section HPABK is eliminated, and that a current source IBS and a selector switch SWS2 are added to the bias control section BSCTL to compensate for the elimination of the bias detection circuit. The selector switch SWS2 chooses whether the bias generation circuit BSGEN receives the output of the digital-to-analog conversion circuit DAC or the output of the current source IBS.

When, for instance, in a situation where the bias generation circuit BSGEN is used, a predetermined current from the current source IBS is applied to a node to which the bias setup voltage Vb is applied, a voltage in which the manufacturing variations of the resistor Rb and diodes Db1, Db2 are reflected is developed at the node (Vb). Therefore, when the error amplifier EAb is used to detect the error between the voltage developed at the node (Vb) and the pre-calculated, predetermined reference voltage Vref, the bit correction value ΔBC to be reflected in the digital-to-analog conversion circuit DAC in the normal operation mode can be more or less estimated in accordance with the magnitude of the detected error.

When the above-described exemplary configuration is used, the manufacturing variations in the bias generation circuit BSGEN can be corrected to a certain extent although it is difficult to correct the variations of the bias setup voltage Vb output from the digital-to-analog conversion circuit DAC.

In such an instance, there is no need to use the bias detection circuit SENS shown in FIG. 1 and the path for returning to the bias control section BSCTL from the bias detection circuit SENS. Consequently, the corrections can be made by using a simple configuration (a small amount of resources).

While the present invention contemplated by its inventors has been described in detail in terms of preferred embodiments, it is to be understood that the present invention is not limited to those preferred embodiments, but extends to various modifications that nevertheless fall within the scope of the appended claims.

For example, the exemplary configurations shown in FIGS. 7 and 10 include a plurality of bias detection circuits. Alternatively, however, one representative bias detection circuit may be incorporated into a semiconductor chip on the presumption that the similar manufacturing variations exist in the bias generation circuits in the same semiconductor chip. Further, the exemplary configuration shown, for instance, in FIG. 1 uses a differential amplifier circuit as the error amplifier EAb. In some cases, however, such a differential amplifier circuit may be substituted, for instance, by an analog-to-digital conversion circuit and an arithmetic circuit that calculates a bit correction value in accordance with the output of the analog-to-digital conversion circuit.

What is claimed is:

1. A wireless communication device comprising:
a first transistor that amplifies power;
a first bias generation circuit that receives a first input voltage level, generates a first current in accordance with the first input voltage level, and sets a bias based on the first current as an operating point of the first transistor;
a digital-to-analog conversion circuit that generates the first input voltage level by converting a digital code to an analog code, the digital code being obtained when a first correction digital code is reflected in a first input digital code;
a first bias detection circuit that detects the first current and generates a first bias detection voltage having a voltage value proportional to the first current;
an error detection circuit that detects the error between the first bias detection voltage and a predetermined first reference voltage; and
a correction circuit that varies the first correction digital code to search for the first correction digital code appropriate for reducing the error detected in the error detection circuit,
wherein, during a correction operation mode, the correction circuit conducts a search under conditions where a first test code is supplied as the first input digital code and a first test reference voltage is supplied as the first reference voltage, the first test reference voltage being predetermined in accordance with the first test code, and retains the first correction digital code obtained as a result of the search, and
wherein, during a normal operation mode, the digital-to-analog conversion circuit to converts a digital code to an analog code, the digital code being obtained when the first correction digital code is reflected in the first input digital code.

2. The wireless communication device according to claim 1,
wherein the digital-to-analog conversion circuit, the error detection circuit, and the correction circuit are formed over a first semiconductor chip, and
wherein the first bias detection circuit includes a first resistor, which is an element external to the first semiconductor chip, and generates the first bias detection voltage by causing the first current to flow to the first resistor.

3. The wireless communication device according to claim 2,
wherein the first bias generation circuit includes:
a first node to which the first input voltage level is applied;
a second resistor coupled at one end to the first node; and
a plurality of diodes series-coupled sequentially between the other end of the second resistor and a ground power supply voltage, the side toward the ground power supply voltage being used as a cathode,
wherein the first bias detection circuit includes a first switch, which is coupled between one end of the first resistor and an anode of a first diode, the first diode being closer to the ground power supply voltage than the other diodes,
wherein, during the correction operation mode, the first bias detection voltage is generated from one end of the first resistor by driving the first switch to ON, and
wherein, during the normal operation mode, the first switch is driven to OFF and the resistance value of the first resistor is set so that the first bias detection voltage is lower than the forward voltage of the first diode.

4. The wireless communication device according to claim 1,
wherein, during the correction operation mode, the correction circuit conducts a search under conditions where a plurality of pieces of the first test code are supplied as the first input digital code and a plurality of pieces of the first test reference voltage are supplied as the first reference voltage, the first test reference voltage being predetermined in accordance with the first test code, and retains a correlation table concerning the first input digital code and the first correction digital code, and
wherein, during the normal operation mode, the digital-to-analog conversion circuit to converts a digital code to an analog code, the digital code being obtained when the correlation table is referenced.

5. The wireless communication device according to claim 2,
wherein the first transistor and the first bias generation circuit are formed over a second semiconductor chip, and
wherein a frequency conversion circuit is additionally formed over the first semiconductor chip, the frequency conversion circuit playing a role of performing frequency conversion between a baseband signal and a predetermined high-frequency signal.

6. The wireless communication device according to claim 1, further comprising:
a coupler that detects the output power of the first transistor;
a power detection circuit that converts the power detected by the coupler to a voltage; and
a selection circuit that chooses between the first bias detection voltage and a voltage output from the power detection circuit,
wherein the error detection circuit detects the error between a predetermined power reference voltage and the voltage output from the power detection circuit in addition to the error between the first bias detection voltage and the first reference voltage.

7. A wireless communication device comprising:
a first transistor that amplifies power;
a second transistor that amplifies power;
a first bias generation circuit that receives a first input voltage level, generates a first current in accordance with the first input voltage level, and sets a bias based on the first current as an operating point of the first transistor;
a second bias generation circuit that receives a second input voltage level, generates a second current in accordance with the second input voltage level, and sets a bias based on the second current as an operating point of the second transistor;
a digital-to-analog conversion circuit that generates the first input voltage level by converting a digital code to an analog code, the digital code being obtained when a first correction digital code is reflected in a first input digital code, and generates the second input voltage level by converting a digital code to an analog code, the digital code being obtained when a second correction digital code is reflected in a second input digital code;
a first bias detection circuit that detects the first current and generates a first bias detection voltage having a voltage value proportional to the first current;
a second bias detection circuit that detects the second current and generates a second bias detection voltage having a voltage value proportional to the second current;
a first switch that couples the first bias detection voltage to a comparison node;
a second switch that couples the second bias detection voltage to the comparison node;
an error detection circuit that detects the error between the first bias detection voltage and a predetermined first reference voltage when the first switch is ON, and detects the error between the second bias detection voltage and a predetermined second reference voltage when the second switch is ON; and
a correction circuit that varies the first correction digital code to search for the first correction digital code appropriate for reducing the error detected in the error detection circuit, and varies the second correction digital code to search for the second correction digital code appropriate for reducing the error detected in the error detection circuit,
wherein, during a first correction operation mode when the first switch is ON and the second switch is OFF, the correction circuit conducts a search under conditions where a first test code is supplied as the first input digital code and a first test reference voltage is supplied as the first reference voltage, the first test reference voltage being predetermined in accordance with the first test code, and retains the first correction digital code obtained as a result of the search,
wherein, during a second correction operation mode when the second switch is ON and the first switch is OFF, the correction circuit conducts a search under conditions where a second test code is supplied as the second input digital code and a second test reference voltage is supplied as the second reference voltage, the second test reference voltage being predetermined in accordance with the second test code, and retains the second correction digital code obtained as a result of the search, and
wherein, during a normal operation mode when the first and second switches are both OFF, the digital-to-analog conversion circuit converts a digital code to an analog code, the digital code being obtained when the first correction digital code is reflected in the first input digital code, and converts a digital code to an analog code, the digital code being obtained when the second correction digital code is reflected in the second input digital code.

8. The wireless communication device according to claim 7,
wherein the digital-to-analog conversion circuit, the error detection circuit, and the correction circuit are formed over a first semiconductor chip,
wherein the first bias detection circuit includes a first resistor, which is an element external to the first semiconductor chip, and generates the first bias detection voltage by causing the first current to flow to the first resistor, and
wherein the second bias detection circuit shares the first resistor with the first bias detection circuit and generates the second bias detection voltage by causing the second current to flow to the first resistor.

9. The wireless communication device according to claim 8,
wherein the first transistor is cascade-coupled to the second transistor, and
wherein the first and second transistors, the first and second bias generation circuits, and the first and second bias detection circuits are formed over a second semiconductor chip.

10. The wireless communication device according to claim 8,
wherein the first transistor, the first bias generation circuit, and the first bias detection circuit are formed over the first semiconductor chip, and
wherein the second transistor, the second bias generation circuit, and the second bias detection circuit are formed over a third semiconductor chip.

11. A wireless communication device comprising:
a first transistor that amplifies power;
a first bias generation circuit that generates a bias in accordance with a first input level and supplies the generated bias to the first transistor;
a digital-to-analog conversion circuit that generates the first input level; and
a correction circuit block,
wherein, during a correction operation mode, the correction circuit block causes the digital-to-analog conversion circuit to apply a first test input level to the first bias generation circuit as the first input level, searches for a first variation amount of the first test input level that matches the level of a first node included in the first bias generation circuit with a predetermined first reference level, and retains the first variation amount as a first correction value, and
wherein, during a normal operation mode, the digital-to-analog conversion circuit generates the first input level in a reflection of the first correction value.

12. The wireless communication device according to claim 11,
wherein the first test input level is generated through the digital-to-analog conversion circuit, and
wherein the correction circuit block includes:
an error amplifier that amplifies the error between the level of the first node and the first reference level; and
a correction circuit that instructs the digital-to-analog conversion circuit to change the first test input level and searches for the first variation amount that reduces the error amplified by the error amplifier.

13. The wireless communication device according to claim 12,
wherein, during the correction operation mode, the correction circuit to conducts a search under conditions where a plurality of input levels are generated as the first test input level and a plurality of reference levels corresponding to the input levels are supplied as the first reference level, and retains a correlation table concerning the first input level and the first correction value, which are obtained as a result of the search, and
wherein, during the normal operation mode, the digital-to-analog conversion circuit references the correlation table to generate the first input level in which the first correction value is reflected.

14. The wireless communication device according to claim 12, further comprising:
a coupler that detects the output power of the first transistor;
a power detection circuit that converts the power detected by the coupler to a voltage; and
a selection circuit that chooses between the level of the first node and a voltage output from the power detection circuit;
wherein the error amplifier detects the error between a predetermined power reference level and the voltage output from the power detection circuit in addition to the error between the first reference level and the level of the first node.

15. The wireless communication device according to claim 11, further comprising:
a second transistor that amplifies power; and
a second bias generation circuit that generates a bias in accordance with a second input level and supplies the generated bias to the second transistor,
wherein, during the correction operation mode, the correction circuit block further applies a second test input level to the second bias generation circuit as the second input level, searches for a second variation amount of the second test input level that matches the level of a second node included in the second bias generation circuit with a predetermined second reference level, and retains the second variation amount as a second correction value, and
wherein, during the normal operation mode, the digital-to-analog conversion circuit generates the second input level in a reflection of the second correction value.

16. The wireless communication device according to claim 15,
wherein the first and second test input levels are generated through the digital-to-analog conversion circuit, and
wherein the correction circuit block includes:
a first switch that couples the level of the first node to a comparison node;
a second switch that couples the level of the second node to the comparison node;
an error amplifier that allows one of two inputs thereof to be coupled to the comparison node, permits the first or second reference level to be applied to the other one of the two inputs, and amplifies the error between the two inputs; and
a correction circuit that instructs the digital-to-analog conversion circuit to change the first test input level and search for the first variation amount appropriate for reducing the error amplified by the error amplifier, and to change the second test input level and search for the second variation amount appropriate for reducing the error amplified by the error amplifier.

* * * * *